(12) United States Patent
Ju

(10) Patent No.: US 7,198,494 B2
(45) Date of Patent: Apr. 3, 2007

(54) ELECTRICAL CONNECTOR HAVING METAL ENHANCEMENT ELEMENTS

(75) Inventor: Ted Ju, Keelung (TW)

(73) Assignee: Lotes Co., Ltd., Keelung (TW)

(*) Notice: Subject to any disclaimer, the term of this patent is extended or adjusted under 35 U.S.C. 154(b) by 0 days.

(21) Appl. No.: 11/331,042

(22) Filed: Jan. 13, 2006

(65) Prior Publication Data
US 2007/0054518 A1 Mar. 8, 2007

(30) Foreign Application Priority Data
Sep. 6, 2005 (CN) .................. 2005 2 0064059

(51) Int. Cl.
*H01R 12/00* (2006.01)
(52) U.S. Cl. ...................... 439/83; 439/331
(58) Field of Classification Search .............. 439/83, 439/331, 570–572, 566
See application file for complete search history.

(56) References Cited

U.S. PATENT DOCUMENTS

| | | | | |
|---|---|---|---|---|
| 5,109,269 A | * | 4/1992 | Holzman | ............... 257/700 |
| 5,938,451 A | * | 8/1999 | Rathburn | ............... 439/66 |
| 6,529,385 B1 | * | 3/2003 | Brady et al. | ............... 361/766 |
| 6,638,082 B2 | * | 10/2003 | Belopolsky et al. | ............ 439/83 |
| 6,755,668 B2 | * | 6/2004 | Copper et al. | ............... 439/83 |
| 6,805,278 B1 | * | 10/2004 | Olson et al. | ............ 228/180.22 |
| 6,916,185 B2 | * | 7/2005 | Hedler et al. | ............... 439/83 |

* cited by examiner

*Primary Examiner*—Michael C. Zarroli
(74) *Attorney, Agent, or Firm*—Troxell Law Office PLLC

(57) ABSTRACT

An electrical connector can be mounted on a printed circuit board, including an insulating main body, and electrical terminals disposed on the printed circuit board. Tin balls are provided on the electrical terminals and a metal piece is provided on the lower surface of the insulating main body. The metal piece protruding from the lower surface of the insulating main body can be soldered on the printed circuit board. The electrical connector according to the present invention is provided with a metal piece on and protruding from the lower surface of the insulating main body. The metal piece can be soldered on the printed circuit board to enhance the retention strength between the electrical connector and the printed circuit board to prevent the tin balls provided on the electrical terminals from breaking away the printed circuit board because the electrical connector can move away from its center of gravity and then tilts relative to the printed circuit board during reflow soldering. Consequently, normal electrical conduction between the electrical connector and the printed circuit board can be ensured.

14 Claims, 4 Drawing Sheets

ELECTRICAL CONNECTOR HAVING METAL ENHANCEMENT ELEMENTS

FIELD OF THE INVENTION

The present invention relates to an electrical connector and particularly to an electrical connector connecting a chip module.

BACKGROUND OF THE INVENTION

At present, an electrical connector employed in industry usually includes an insulating main body and a plurality of electrical terminals disposed on the insulating main body. The insulating main body is provided with a receiving face for a chip module, an installing surface for connecting with the printed circuit board, and a plurality of terminal holes running through the receiving face and the installing surface. The terminal holes are fitted with the electrical terminals, whose one ends are connected with the printed circuit board by the tin balls and other ends are elastically abutted against a corresponding conducting washer provided on the chip module to achieve the electrical conduction between the chip module and the printed circuit board.

However, it is sometimes necessary for a printed circuit board to go through a reflow soldering for a printed circuit board to be installed with electronic devices on the side opposite to the side installed with the electrical connector. During the reflow soldering, the electrical connector installed on the printed circuit board is dangling from the printed circuit board. The electrical connector is only connected with the printed circuit board only by the tin balls provided on the electrical terminals. And the tin balls are getting softer as the temperature surrounding the printed circuit board increases. Although the tin balls can attach to the printed circuit board with the surface tension of molten tin balls, the center of gravity of the electrical connector may move from its centroid and then the electrical connector will tilt a certain degrees relative to the printed circuit board, i.e. the overall electrical connector is not in parallel with the printed circuit board. At the location where the electrical connector moves away from the printed circuit board, the tin balls are inclined to detach from the printed circuit board and in turn the electrical conduction between the electrical connector and the printed circuit board would be negatively affected.

It is therefore necessary to provide a novel electrical connector to overcome the shortcoming described above.

SUMMARY OF THE INVENTION

An object of the present invention is to provide an electrical connector which can ensure good electrical conduction.

In order to accomplish the objects of the present invention, an electrical connector according to the present invention can be mounted on a printed circuit board, including an insulating main body, and electrical terminals disposed on the printed circuit board. Tin balls are provided on the electrical terminals and a metal piece is provided on the lower surface of the insulating main body. The metal piece protruding from the lower surface of the insulating main body can be soldered on the printed circuit board.

Compared with the prior art, an electrical connector according to the present invention is provided with a metal piece on and protruding from the lower surface of the insulating main body. The metal piece can be soldered with the printed circuit board to enhance the retention strength between the electrical connector and the printed circuit board to prevent the tin balls provided on the electrical terminals from breaking away the printed circuit board because the electrical connector can move away from its center of gravity and then tilts relative to the printed circuit board during reflow soldering. Consequently, normal electrical conduction between the electrical connector and the printed circuit board can be ensured.

BRIEF DESCRIPTION OF THE DRAWINGS

The present invention can be more fully understood by reference to the following description and accompanying drawings, in which.

DETAILED DESCRIPTION OF THE INVENTION

Figure 1:
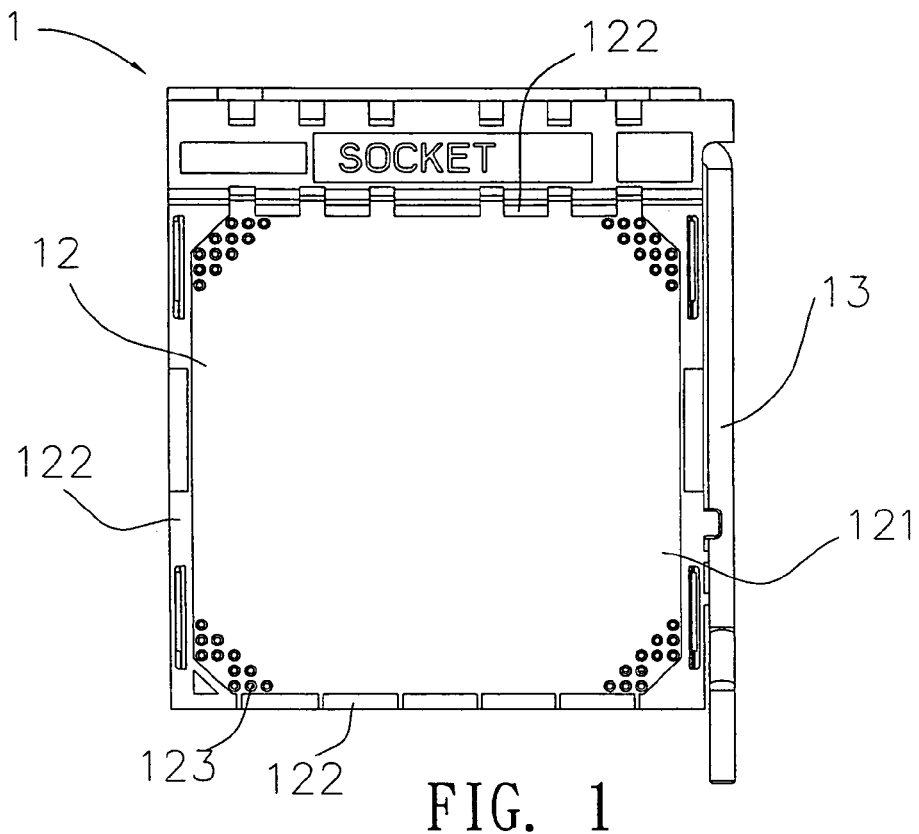
FIG. 1 is a plane view of a preferred embodiment of an electrical connector according to the present invention.
Figure 2:
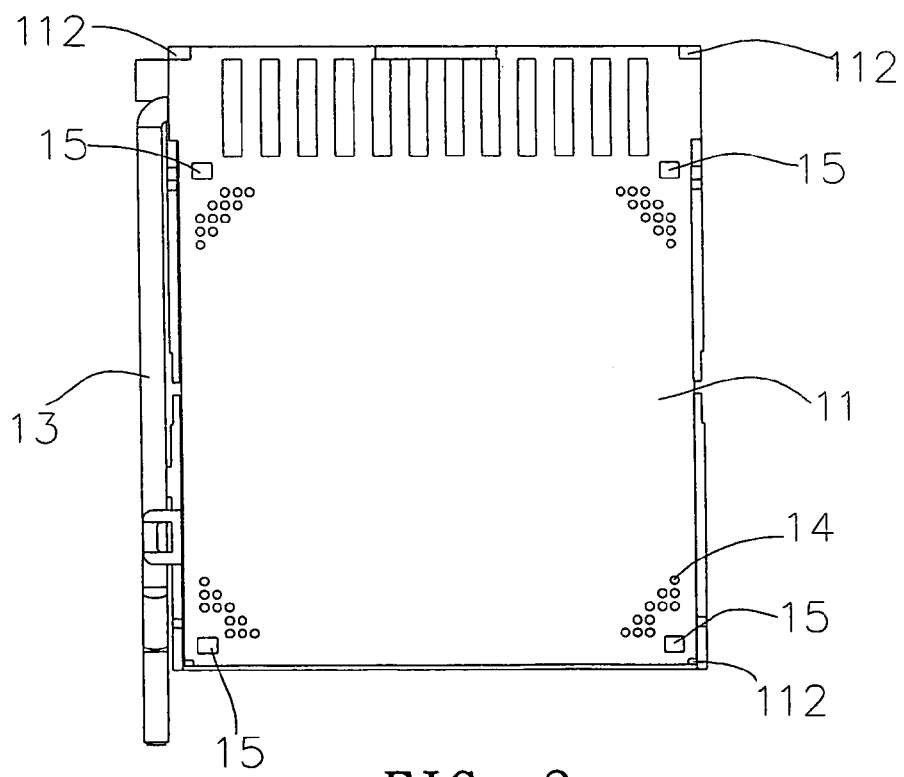
FIG. 2 is a bottom view of a preferred embodiment of an electrical connector according to the present invention.
Figure 3:
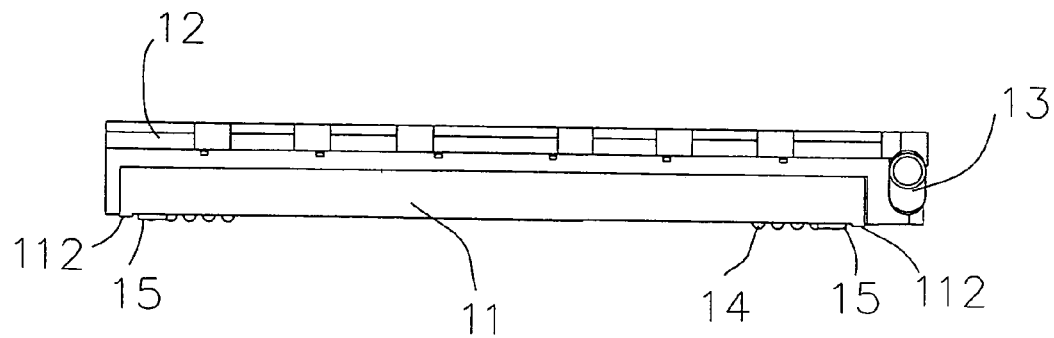
FIG. 3 is a front view of a preferred embodiment of an electrical connector according to the present invention.
Figure 4:
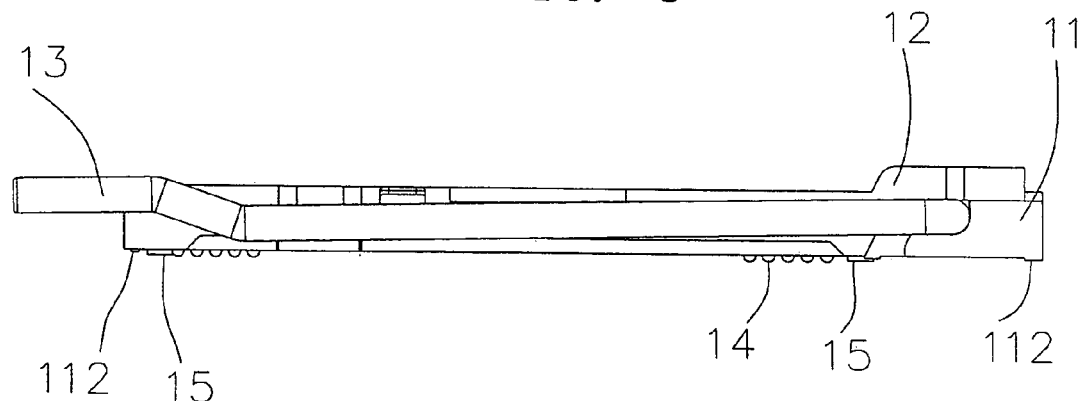
FIG. 4 is a right-side view of a preferred embodiment of an electrical connector according to the present invention.
Figure 5:
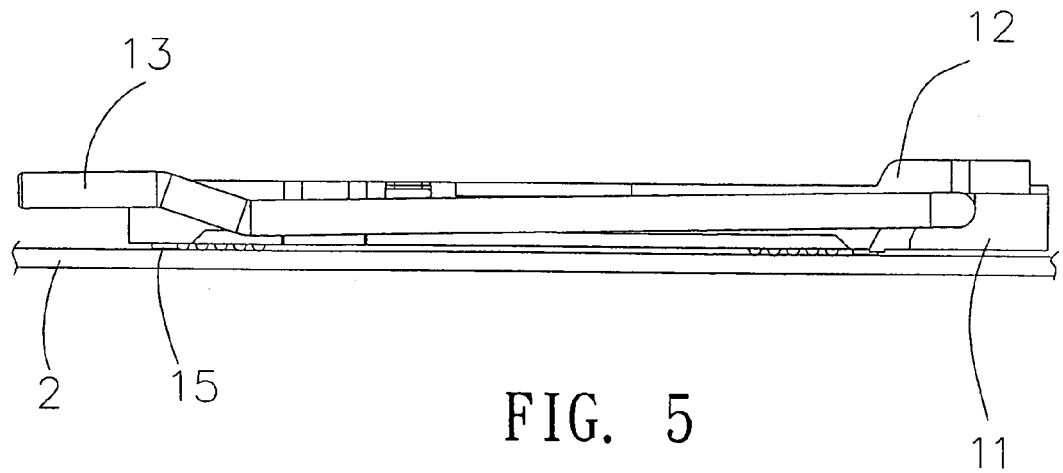
FIG. 5 is a perspective view of a preferred embodiment of an electrical connector according to the present invention.

Referring to FIGS. 1 to 5, an electrical connector 1 according to the present invention comprising an insulating main body and electrical terminals (not shown) is to connect a chip module (not shown) onto a printed circuit board 2.

The insulating main body comprises a base body 11 disposed on the printed circuit board 2 and a cover body 12 engaged with the base body 11. The base body 11 is provided with a plurality of terminal holes (not shown) running through the upper and lower surfaces to receive electrical terminals (not shown). The electrical terminals (not shown) are provided with a plurality of tin balls 14 (partially shown), part of which protrude from the lower surface of the base body 11 to be soldered with the printed circuit board 2. The four corners of the lower surface of the base body 11 are provided with metal pieces 15 protruding from the lower surface of the base body 11 (alternatively, the lower surface of the base body 11 can be provided with evenly distributed metal pieces 15 around the perimeter of the lower surface). The metal pieces 15 and the base body 11 can be integrally manufactured, or the base body 11 is provided with a notch (not shown) into which the metal pieces 15 can be mounted. The lower surface of the metal piece 15 is larger than the diameter of the tin ball 14 and can be soldered onto the printed circuit board 2. Also, the lower surface of the base body 11 is provided with a plurality of protrusions 112 whose height is smaller than the distance from the base of the tin ball 14 to the lower surface of the base body 11. A receiving face 121 is provided on the cover body 12 to receive a chip module (not shown). The perimeter of the receiving face 121 is provided with a contacting part 122 to contact against the perimeter of the chip module (not shown). A plurality of through holes 123 are provided on the cover body 12 corresponding to the electrical terminals (not shown). An actuation device 13 is disposed between the base body 11 and the cover body 12. The preferred embodiment of the actuation device 13 is a rocker. The cover body 12 can slide relative to the base body 11 under the action of the rocker 13.

When the electrical connector 1 and the printed circuit board 2 are being soldered, the metal piece 15 on the lower surface of the base body 12 is soldered together with the printed circuit board 2, apart from the tin balls 14 and the printed circuit board 2 are soldered together. The printed circuit board 2 can be securely connected with the electrical connector 1 after soldering because the area of the metal piece 15 is larger and so is its contacting area with the printed circuit board 2 after soldering. Consequently, the tin balls 14 provided on the electrical terminals will be prevented from breaking away the printed circuit board 2 when the electrical connector 1 moves away from its center of gravity and then tilts relative to the printed circuit board 2 during reflow soldering. Therefore, normal electrical conduction between the electrical connector 1 and the printed circuit board 2 can be ensured.

Figure 6:
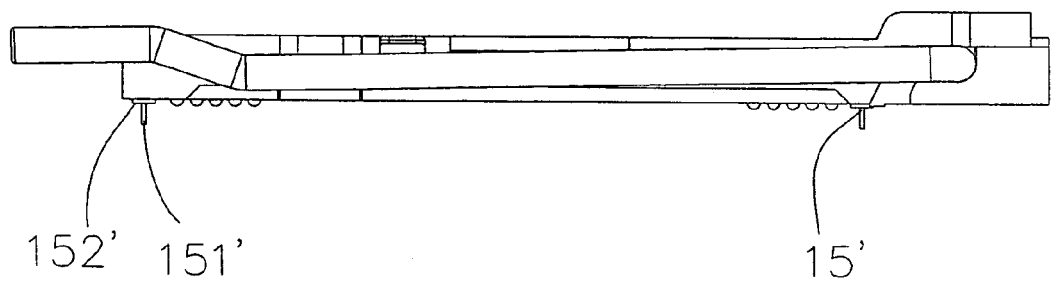
FIG. 6 is a schematic illustration of another preferred embodiment of an electrical connector according to the present invention.
Figure 7:
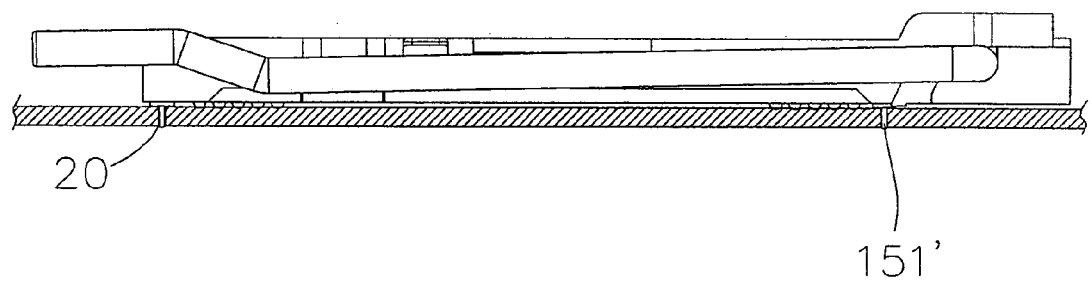
FIG. 7 is a perspective view of the electrical connector of FIG. 6.

FIGS. 6 and 7 illustrate the second preferred embodiment of an electrical connector according to the present invention. The difference between the present embodiment and the embodiment described above is that an inserting part 151' is disposed on the bottom of the metal piece 15'. The inserting part 151' can be inserted into and soldered securely with its corresponding hole 20 on the printed circuit board 2. Also, the top of the inserting part 151' of the metal piece 15' is provided with a protrusion 142' which can be abutted against the surface of the printed circuit board 2. The height of the protrusion 152' is smaller than the distance from the base of the tin ball 14 to the lower surface of the base body 11. The present embodiment can achieve the object achieved by the embodiment described above.

Figure 8:
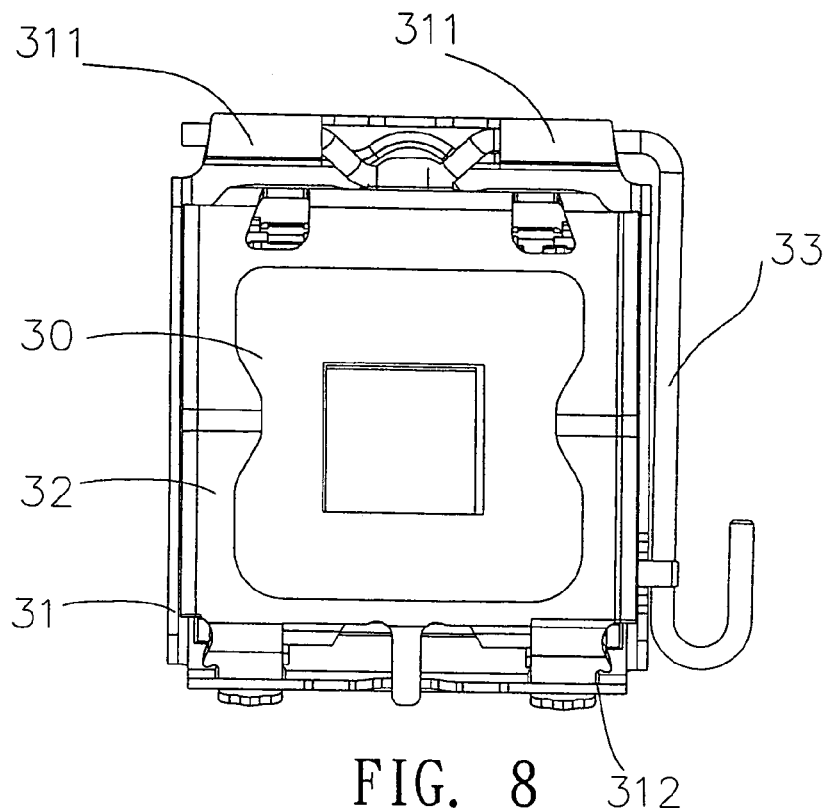
FIG. 8 is a schematic illustration of another preferred embodiment of an electrical connector according to the present invention.
Figure 9:
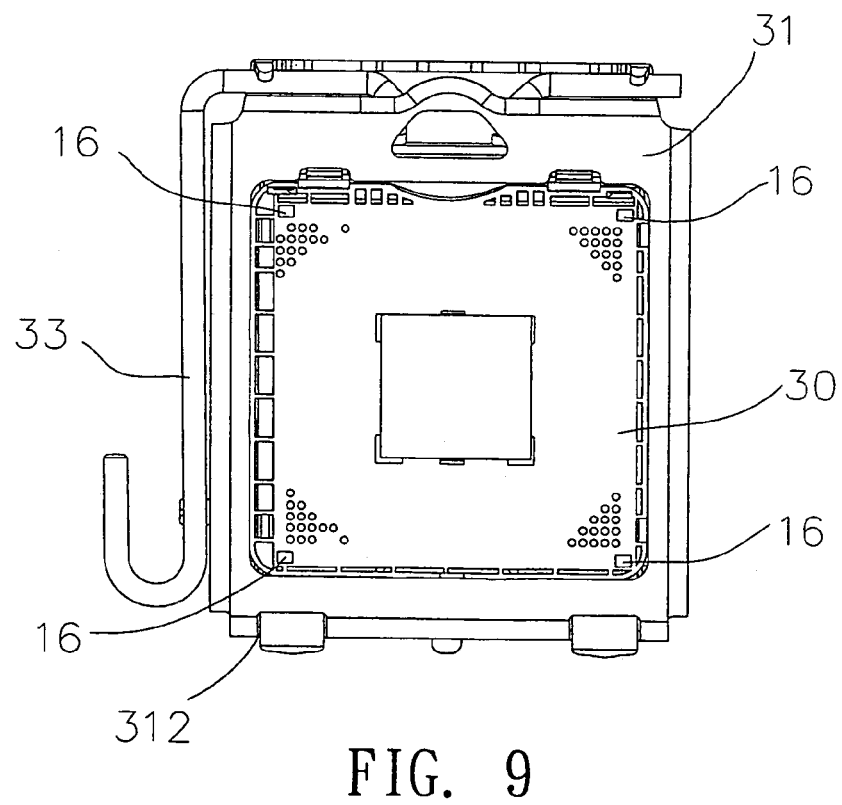
FIG. 9 is a perspective view of the electrical connector of FIG. 8.

FIGS. 8 and 9 illustrate the third preferred embodiment of an electrical connector according to the present invention. The difference between the present embodiment and the first embodiment described above is that the electrical connector is provided with a securing mechanism. The securing mechanism includes a base 31 for receiving and securing an insulating main body 30 as well as a cover body 32 and a rocker 33 pivotedly connected, respectively, to the base body 31. The rocker 33 can be pressed to engage with the cover body 33 onto the base 31. One side of the base 31 is provided with a clipping part 311 pivotedly connected to the rocker 33, and the other side of the base 31 relative to the clipping part 311 is provided with a rotating shaft hole 312 releasably connected with the cover body 32. Certainly, the metal piece 16 can be regarded as a structure described in the second embodiment described above. The present embodiment can achieve the object achieved by the embodiment described above.

Consequently, in the embodiment of the present invention, a metal piece is provided on and protruding from the lower surface of the insulating main body. The metal piece can be soldered with the printed circuit board to enhance the retention strength between the electrical connector and the printed circuit board to prevent the tin balls provided on the electrical terminals from breaking away the printed circuit board because the electrical connector can move away from its center of gravity and then tilts relative to the printed circuit board during reflow soldering. Consequently, normal electrical conduction between the electrical connector and the printed circuit board can be ensured. It is appreciated that the electrical connected according to the present invention can improve the shortcoming of conventional electrical connector.

While the invention has been described with reference to the a preferred embodiment thereof, it is to be understood that modifications or variations may be easily made without departing from the spirit of this invention, which is defined by the appended claims.

What is claimed is:

1. An electrical connector, comprising:
   an insulating main body provided with a receiving face for a chip module, wherein the receiving surface is provided with a plurality of terminal holes;
   at least an electrical terminal disposed in the terminal hole;
   at least a tin ball disposed on the electrical terminal; and
   a metal piece disposed on and protruding from the lower surface of the insulating main body, wherein the metal piece can be soldered with a printed circuit board, the metal piece being configured to secure the insulating main body to the printed circuit board, when soldered to the printed circuit board.

2. The electrical connector as defined in claim 1, wherein the metal piece is disposed on the perimeter of the lower surface of the insulating main body.

3. The electrical connector as defined in claim 1, wherein the meal piece is disposed on the four corners of the lower surface of the insulating main body.

4. The electrical connector as defined in claim 1, wherein the surface of the metal piece can be bonded with the printed circuit board by Surface Mount Technology (SMT).

5. The electrical connector as defined in claim 1, wherein the lower surface of the metal piece is larger than the diameter of the tin ball.

6. The electrical connector as defined in claim 1, wherein the lower surface of the insulating main body is provided with a plurality of protrusions whose height is smaller than the distance from the base of the tin ball to the lower surface of the base body.

7. The electrical connector as defined in claim 1, wherein on the bottom of the metal piece is further provided with an inserting part which can be inserted into and soldered securely with a corresponding hole on the printed circuit board.

8. The electrical connector as defined in claim 7, wherein on the top of the inserting part of the metal piece is further provided with a protrusion which can be abutted against the surface of the printed circuit board and whose height is smaller than the distance from the base of the tin ball to the lower surface of the base body.

9. The electrical connector as defined in claim 1, wherein the insulating main body further comprises a base body disposed on the printed circuit board and a cover body engaged with the base body, wherein an actuation device is disposed between the base body and the cover body and the metal piece is disposed on the lower surface of the base body.

10. The electrical connector as defined in claim 9, wherein the base body is further provided with a notch into which the metal pieces can be mounted.

11. The electrical connector as defined in claim 10, wherein the metal piece and the base body can be integrally manufactured.

12. The electrical connector as defined in claim 1, further comprising a securing mechanism including a base body, a cover body, and a rocker, wherein the securing mechanism is to receive and secure the insulating main body, and the rocker is pivotedly connected between the base and the cover body and can be pressed to engage with the cover body onto the base.

13. The electrical connector as defined in claim 12, wherein one side of the base body is provided with a clipping part pivotedly connected to the rocker.

14. The electrical connector as defined in claim 13, wherein the other side of the base body relative to the clipping part is provided with a rotating shaft hole releasably connected with the cover body.

* * * * *